(12) United States Patent
Ogino et al.

(10) Patent No.: US 6,436,542 B1
(45) Date of Patent: Aug. 20, 2002

(54) MULTILAYER STRUCTURE AND PROCESS FOR PRODUCING THE SAME

(75) Inventors: Etsuo Ogino; Kenji Mori; Yoshifumi Kijima; Tetsuro Kawahara; Kazuhiro Doushita; Hiroyuki Inomata, all of Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 142 days.

(21) Appl. No.: 09/613,726

(22) Filed: Jul. 11, 2000

(30) Foreign Application Priority Data

Jul. 14, 1999 (JP) ............................................. 11-200594

(51) Int. Cl.[7] .......................... B32B 17/06; B32B 15/04
(52) U.S. Cl. ....................... 428/432; 428/426; 428/428; 428/448; 428/697; 428/702
(58) Field of Search ................................ 428/426, 428, 428/432, 448, 702, 697

(56) References Cited

U.S. PATENT DOCUMENTS

2001/0008696 A1 * 7/2001 Takahama et al. .......... 428/446

FOREIGN PATENT DOCUMENTS

JP         10-310653      * 11/1998

OTHER PUBLICATIONS

XP–002149112—May 18, 1999 (Abstract).
XP–002149113—Apr. 6, 1999 (Abstract).
XP–002149114—Oct. 20, 1998 (Abstract).
XP–002149115—Nov. 26, 1996 Abstract Search Report.

* cited by examiner

*Primary Examiner*—Deborah Jones
*Assistant Examiner*—Andrew T Piziali
(74) *Attorney, Agent, or Firm*—Sughrue Mion, PLLC

(57) ABSTRACT

A conductive sinter obtained from a mixture of titanium oxide particles and 2.5% by weight niobium oxide particles is used as a target in direct current sputtering to form a photocatalytically active film mainly comprising titanium oxide on a glass substrate. The target has a surface resistance of 500 $\Omega/\square$ or lower and the sputtering is conducted while heating the substrate at 230° C. The photocatalytically active film is based on an amorphous matrix. This process is free from problems of a conventional process in which a photocatalytically active titanium oxide film is deposited by reactive sputtering using titanium metal as a target. The problems are that the substrate needs to be heated to 350° C. or higher and that the deposited film does not have high photocatalytic activity.

7 Claims, 2 Drawing Sheets

MULTILAYER STRUCTURE AND PROCESS FOR PRODUCING THE SAME

FIELD OF THE INVENTION

The present invention relates to a multilayer structure which functions as a photocatalyst and can render its surface hydrophilic upon irradiation with ultraviolet rays or visible rays. The present invention further relates to a process for producing the same.

BACKGROUND OF THE INVENTION

Members comprising a substrate coated with a titanium oxide film functioning as a photocatalyst are used in various applications. Such members are applicable to various articles so as to take advantage of the hydrophilicity resulting from their photocatalytic function for various purposes such as, e.g., antifogging, cleaning by rain, cleaning by water washing, and antifouling. For example, in the case of articles wherein the substrate is a glass plate, such as, e.g. , windshields and sideview mirrors for vehicles, window glasses for buildings, and mirrors, a technique is used in which the substrate is coated with a photocatalyst film whose surface becomes hydrophilic and is thereby prevented from being clouded with steam or covered with adherent waterdrops.

JP-A-10-278165 (the term "JP-A" as used herein means an "unexamined published Japanese patent application") discloses a technique in which a metal target comprising titanium as the main component is used to conduct sputtering in an oxygen-containing atmosphere and the resulting deposit is heated to thereby form on a glass plate a photocatalyst film having anatase crystals and excellent resistance to abrasion and wearing.

However, in order for the technique described above to form a titanium oxide film having photocatalytic activity, it is necessary that a titanium oxide film should be deposited on a substrate heated to 300° C. or higher or that a titanium oxide film which has been deposited on a substrate having room temperature should be heated to a temperature as high as 600° C. or higher. Furthermore, there has been a problem that in the reactive sputtering in which a titanium metal target is used in an oxygen-containing atmosphere, the glow discharge becomes unstable as an electrically insulating oxide accumulates on the titanium metal surface and, as a result, a titanium oxide film cannot be stably obtained.

JP-A-10-310653 discloses a technique in which an anatase titanium oxide film or rutile titanium oxide film is deposited on a glass plate by the sol coating method, organic titanate method, electron beam vapor deposition method, or the like. There is a description therein to the effect that the energy band gap between the conductive band and the valence band in a titanium oxide film functioning as a photocatalyst is regulated by incorporating a metal oxide selected from ruthenium oxide, cobalt oxide, cerium oxide, chromium oxide, rhodium oxide, and vanadium oxide to thereby effectively obtain hydrophilicity.

However, the technique described above has had a problem that a step of heating at a temperature as high as 350° C. or higher is necessary for obtaining a crystalline titanium oxide film having photocatalytic activity, resulting in a complicated production process.

JP-A-1-92176 discloses a technique in which a titanium oxide photocatalyst film is deposited on a glass plate by reactive sputtering using titanium metal as a sputtering target and this titanium oxide film is doped with ions of a metal such as niobium, cobalt, or chromium by ion implantation to improve catalytic activity.

However, the technique described above has had drawbacks that an expensive ion injector is necessary for injecting metal ions in a glass by ion injection, and that it is virtually difficult to deposit a photocatalytically active film on a glass having a relatively large area, such as a window glass for buildings, etc., on an industrial scale.

SUMMARY OF THE INVENTION

The present invention has been achieved in order to overcome the problems described above.

One object of the present invention is to provide a multilayer structure comprising a substrate and formed thereon a film having satisfactory photocatalytic activity and practical antifouling properties.

Another object of the present invention is to provide a process for producing a multilayer structure comprising a substrate and formed thereon a film having photocatalytic activity and antifouling properties.

According to the first embodiment of the present invention provides, there is provided a process for producing a multilayer structure comprising a substrate and formed thereon a film mainly comprising titanium oxide and having photocatalytic activity, which comprises sputtering a conductive sinter target obtained by sintering a mixture of particles of titanium oxide and particles of at least one metal oxide selected from the group consisting of niobium oxide, tantalum oxide, vanadium oxide, zirconium oxide, tin oxide, chromium oxide and copper oxide, in an atmosphere capable of having a regulated vacuum to form the film mainly comprising titanium oxide and having photocatalytic activity on the substrate.

The film mainly comprising titanium oxide (hereinafter referred to as "titanium oxide film") in the present invention is obtained by sputtering, in an atmosphere capable of having a regulated vacuum, a conductive target obtained by sintering a mixture of particles of titanium oxide as the main component and particles of at least one metal oxide, as a minor component, selected from the group consisting of niobium oxide, tantalum oxide, vanadium oxide, zirconium oxide, tin oxide, chromium oxide and copper oxide. The surrounding gas when sputtering that can be used is an inert gas such as argon or a mixed gas comprising an inert gas and oxygen.

Especially when an oxygen-containing atmosphere having a reduced pressure is used in order to sputter a titanium oxide film which does not have a considerable deficiency of oxygen as compared with the stoichiometric amount and is transparent in the visible region, the target surface is inhibited from being covered with an electrically insulating substance because a small oxygen amount is sufficient for the atmosphere.

The target used in the present invention, which is an oxide sinter containing titanium oxide as the main component, is electrically conductive in such a degree that electric current can flow through the surface thereof. It is preferred that a direct current glow discharge be used to bombard the conductive target and thereby deposit a film. This is because a direct current power source, which is relatively inexpensive, can be used to generate a stable glow discharge and deposit a photocatalytically active titanium oxide film on a substrate.

The target having conductivity for use in the present invention can be obtained by sufficiently mixing particles, preferably fine particles, of titanium oxide with particles, preferably fine particles, of at least one metal oxide selected from the group consisting of niobium oxide, tantalum oxide, vanadium oxide, tin oxide, chromium oxide and copper oxide, and forming the powder mixture into a given shape by pressure molding. Conventional cold pressing or hot pressing method can be used for this pressure molding.

The conductivity of the target for use in the present invention is preferably such that the surface resistance thereof is 500 Ω/□ or lower, in order to maintain a glow discharge for sputtering the target over a long period of time to thereby form a titanium oxide film in a stable manner. If the surface resistance exceeds 500 Ω/□, it is not preferable in that the glow discharge is apt to be interrupted. From the standpoint of even more stably maintaining a glow discharge over a long period of time, the surface resistance of the target is more preferably 50 Ω/□ or lower.

In the present invention, the formation of a photocatalytically active titanium oxide film is preferably conducted at a substrate temperature of 170° C. or higher. If the substrate temperature is lower than 170° C., it is undesirable in that the titanium oxide film obtained has insufficient resistance to abrasion and wearing and has low photocatalytic activity. From this standpoint, the substrate temperature is more preferably 200° C. or higher.

On the other hand, if the substrate temperature exceeds 270° C. during film formation, the titanium oxide film tends to have a higher degree of anatase crystal orientation and, unexpectedly, the photocatalytic activity thereof decreases gradually. From this standpoint, the substrate temperature during film deposition is preferably 270° C. or lower, more preferably 250° C. or lower.

Preferred metal oxides to be contained in titanium oxide in the present invention are niobium oxide, vanadium oxide and tantalum oxide because these metal oxides are effective not only in relatively easily maintaining a glow discharge necessary for sputtering the sinter target but in obtaining a titanium oxide film having enhanced photocatalytic activity. Of those, niobium oxide is most preferable.

According to the second embodiment of the present invention, there is provided a multilayer structure comprising a substrate and formed thereon a film mainly comprising titanium oxide and having photocatalytic activity (hereinafter referred to as "titanium oxide film"), wherein the film contains as a minor component at least one metal oxide selected from the group consisting of niobium oxide, tantalum oxide, vanadium oxide, zirconium oxide, tin oxide, chromium oxide and copper oxide and is substantially amorphous when analyzed by X-ray diffraction method.

In the case where the titanium oxide film formed is composed of crystals, many grain boundaries are present therein. Electron-hole pairs which have been excited by light in the titanium oxide film are trapped by many lattice defects present on those grain boundaries, so that the number of electron-hole pairs present on the film surface, which contribute to photocatalytic activity, is reduced. Because of this, such a titanium oxide film has reduced photocatalytic activity. In contrast, the multilayer structure of the present invention is reduced in the trapping since it mainly comprises an amorphous matrix. This constitution is thought to bring about a high photoexcitation efficiency. The multilayer structure of the present invention therefore has high photocatalytic activity.

The titanium oxide film is characterized in that it is less apt to have a crystalline structure because the titanium oxide contains a small amount of one or more metal oxides.

In the present invention, the content of the metal oxide(s) as a minor component in the titanium oxide is preferably 1% by weight or higher, more preferably 2.5% by weight or higher. If the content of metal oxides as a minor component in the film is lower than 1% by weight, it is undesirable in that not only stable photocatalytic activity is difficult to obtain but also the target is less apt to retain conductivity (electricity-passing properties) in a degree so as to conduct sputtering in a stable manner, making it difficult to stably form a titanium oxide film.

On the other hand, the content of the metal oxide(s) as a minor component is preferably 10% by weight or lower, more preferably 5% by weight or lower. This is because if the content of the metal oxide(s) exceeds 10% by weight, the content of titanium oxide decreases in relative amount, resulting in lowering photocatalytic activity.

In the present invention, preferred metal oxides as the minor component are niobium oxide, vanadium oxide and tantalum oxide from the standpoints of obtaining high photocatalytic activity and forming a stable glow discharge to form a titanium oxide film with satisfactory reproducibility. Especially preferred from such standpoints is niobium oxide.

Usable substrates include ones made of inorganic materials such as glasses and ceramics and ones made of organic materials such as plastics because in the process of the present invention, film formation on substrates is possible at relatively low temperature. Examples of applications of such substrates include window glasses for buildings and vehicles, exterior and interior materials for buildings, Braun tubes, PDP displays, liquid-crystal display panels, optical recording media, magnetic recording media, and members or housings of domestic electrical appliances or OA apparatus.

In the case where a glass plate, especially one containing alkali components, such as a soda-lime silicate composition, is used as a substrate, it is preferred to dispose, between this glass substrate and a titanium oxide film, a primer film serving to prevent the alkali components of the substrate from dissolving in the titanium oxide film. From the standpoint of further improving antifouling properties, it is preferred to partly or wholly coat the titanium oxide film of the present invention with a hydrophilic film.

Figure 1:
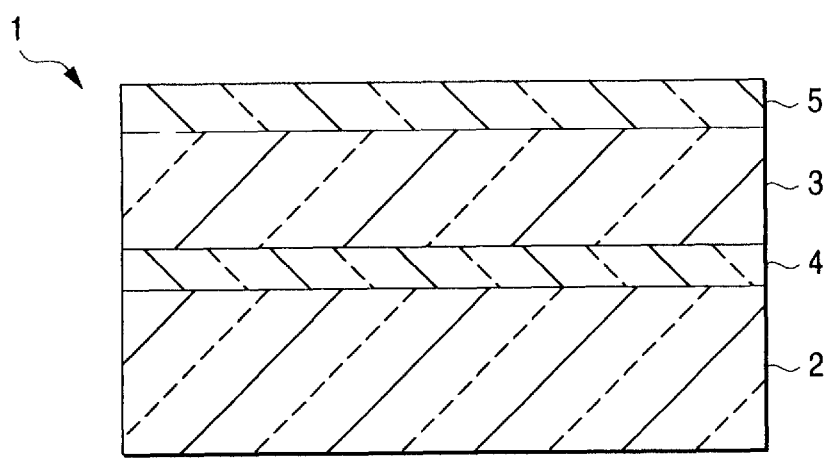
FIG. 1 is a sectional view showing one embodiment of the multilayer structure according to the present invention.

Reference Numerals in the drawings are as follows:

1: Multilayer structure of the present invention
2: Glass substrate
3: Photocatalytically active film mainly comprising titanium oxide
4: Primer film
5: Hydrophilic film

DETAILED DESCRIPTION OF THE INVENTION

Embodiments of the present invention will be explained in detail below.

Figure 2:
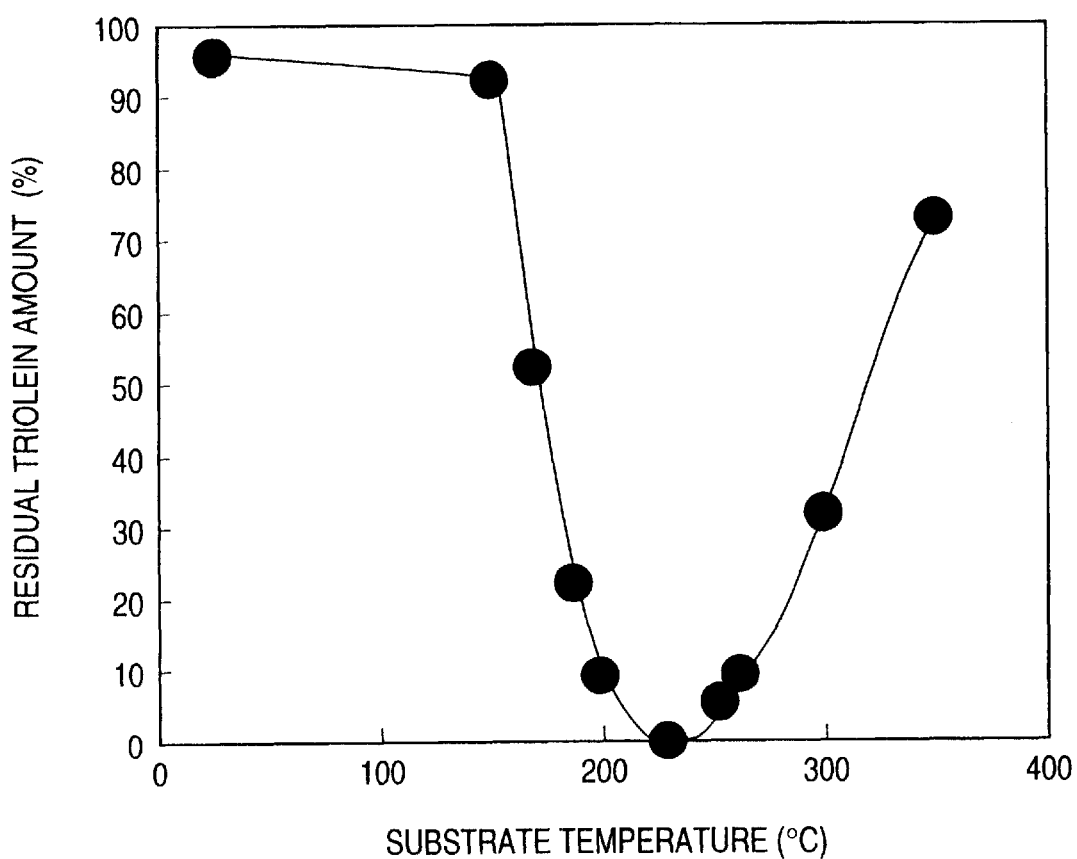
FIG. 2 is a graphic presentation showing the influence of substrate temperature during titanium oxide film formation on residual triolein amount.
Figure 3:
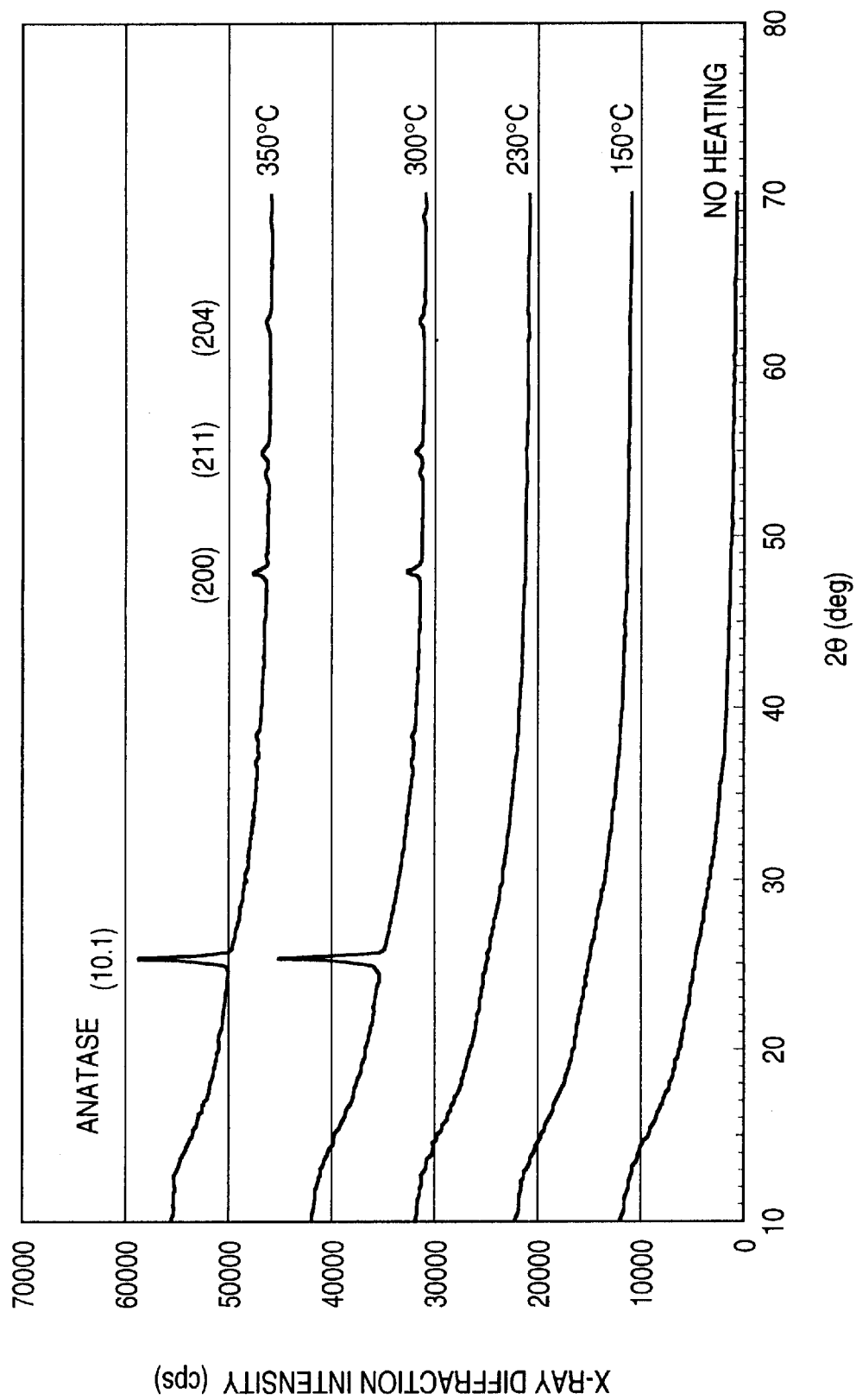
FIG. 3 is a graphic presentation showing the influence of substrate temperature during titanium oxide film formation on the crystalline structure of the film.

FIG. 1 is a sectional view showing one embodiment of the multilayer structure according to the present invention. This multilayer structure 1 comprises a glass substrate 2 and, superposed on one side thereof in this order, a primer film 4 comprising silicon dioxide serving to prevent alkali dissolution, a titanium oxide film 3 having photocatalytic activity, and a hydrophilic film 5. FIG. 2 is a graphic presentation showing the influence of the substrate temperature during titanium oxide film formation on the residual triolein amount. FIG. 3 is a graphic presentation showing the influence of the substrate temperature during titanium oxide film formation on the crystalline structure of the film.

Examples of the glass substrate include plates made of a soda-lime silicate glass, alkali borosilicate glass and aluminoborosilicate glass. Examples of plastic substrates include substrates made of a polycarbonate resin, acrylic resin and polystyrene resin. In the case of using a substrate containing an alkali component, e.g., sodium ions, as in a soda-lime silicate glass, it is preferred to dispose a film of a metal oxide such as silicon dioxide as an alkali dissolution preventive film between the substrate and a titanium oxide film in order to prevent the alkali component, which is apt to move within the glass, from coming into the titanium oxide film from the glass. Silicon dioxide can be film-formed by conventional technique such as sputtering, CVD or a method using an aqueous solution containing hydrosilicofluoric acid supersaturated with silicon dioxide. The thickness of this silicon dioxide film is preferably from 10 to 100 nm.

The sinter target used in forming a photocatalytically active titanium oxide film according to the present invention is produced by, for example, the following manner. Titanium oxide and niobium oxide each are regulated so as to have a particle diameter of from about 0.01 to 50 μm. The niobium oxide is mixed with the titanium oxide in an amount of from 1 to 10% by weight based on the weight of the titanium oxide, and this mixture is molded into a given shape by cold isostatic pressing in water in which the powder mixture is pressed at 3 t/cm². The resulting molded product is degreased at 400 to 500° C., preliminarily burned in an oxygen atmosphere at 1300 to 1500° C. for 4 to 6 hours, and then subjected to hot isostatic pressing at 1,350 to 1,450° C. under a pressure of about 100 MPa in an atmosphere comprising argon and oxygen.

Conductivity is imparted to the sputtering target according to the present invention to such a degree that the target is not charged during sputtering with a direct current glow discharge. From the standpoint of easily obtaining such target surface conductivity, preferred metal oxides for use as the minor component are niobium oxide, vanadium oxide and tantalum oxide. Especially preferred is niobium oxide.

By using the oxide sinter target which is not charged, sputtering can be conducted with a direct current glow discharge. The partial oxygen pressure of the atmosphere used for this sputtering may be lower than that in the reactive sputtering method in which titanium metal is used as a target. Even when the sputtering is conducted over a long period of time, the accumulation of an electrically insulating substance on the target surface can be inhibited. The sputtering atmosphere is regulated so as to have a pressure of from 1 to 5 mTorr in magnetron sputtering (MS) or dual magnetron sputtering (DMS). For maintaining this pressure, the gas to be introduced into the film-formation chamber is preferably regulated so as to have a composition having an oxygen content of from 0.5 to 10% by volume.

The primer film used as an alkali dissolution preventive film in the present invention may be a film of a metal oxide or a film of a nitride. Especially preferred are silicon dioxide, silicon nitride and silicon oxynitride because these compounds show satisfactory adhesiveness to glass plates and titanium oxide films.

In the present invention, both hydrophilicity and antifouling properties can be imparted to the substrate more satisfactorily by coating the titanium oxide film with a hydrophilic film transparent to ultraviolet or visible light. Preferred examples of this hydrophilic film include silicon dioxide films or films containing silicon dioxide as the main component.

Methods for forming the primer film or hydrophilic film are not particularly limited, and conventional methods can be used, such as sputtering, CVD using an organosilane as a starting material, and a method using an aqueous hydrosilicofluoric acid solution supersaturated with silicon dioxide.

The present invention will be explained in more detail below by reference to the following Examples and Comparative Examples, but it should be understood that the invention is not construed as being limited thereto. In each of those Examples and Comparative Examples, the following conditions were used in forming a titanium oxide film.

Target size: 38 cm (length)×13 cm (width)×6 mm (thickness)

Sputtering power: 3 kW

Pressure of sputtering atmosphere: 3 mTorr

Gas introduced: argon/oxygen mixed gas or oxygen gas

Substrate heating: various temperatures according to experiments in the range of from room temperature (about 25° C.) to 350° C.

EXAMPLE 1

A mixture of 2.5% by weight niobium oxide and 97.5% by weight titanium oxide was molded into the shape shown above by cold isostatic pressing in water at a pressure of 3 t/cm². This molded product was degreased at 450° C., preliminarily burned in an oxygen atmosphere at 1,400° C. for 5 hours, and then subjected to hot isostatic pressing at 1,400° C. under a pressure of about 100 MPa in an atmosphere composed of argon and a small proportion of oxygen.

The oxide sinter target thus obtained had a surface resistance of 5 Ω/□. Using this target, a titanium oxide film having a thickness of 250 nm was formed on a 30 cm-square float glass plate having a soda-lime silicate composition under the film-formation conditions shown in Table 1. The substrate temperature during film-formation was regulated to 230° C. Thus, Sample 1 was obtained. The titanium oxide film of the multilayer structure obtained was examined for photocatalytic performance (triolein-decomposing ability and contact angle with water) and crystalline state. Antifouling performance also was evaluated.

The examination and evaluation methods are as follows.

Film crystallinity: Crystalline state of the film was judged based on X-ray diffraction peaks obtained with $CuK_\alpha$ line (50 kV, 200 mA).

Triolein-decomposing ability: The side coated with the titanium oxide film was coated with about 2 mg of triolein. The film side of this sample was then irradiated with black light (containing ultraviolet) at an intensity of 3 mW/cm$^2$. After 43 hours, the residual triolein amount was determined and shown in terms of %.

Antifouling performance: The multilayer structure was exposed outdoors for 2 months, and the surface thereof was then visually examined. The adhesion of fouling substances, such as waterdrop marks resulting from rain or dust particles, was evaluated and indicated by ○, Δ or x. The results of this comparative evaluation, in which the fouled state of the glass plate not coated with a titanium oxide film is taken as x, are shown in Table 1.

x: Considerable adhesion of fouling substances derived from waterdrops, etc., and the sample looked white in terms of reflected light.

Δ: Slightly reduced adhesion of fouling substances.

○: Even more reduced adhesion of fouling substances, and the sample looked less white in terms of reflected light.

The results of the evaluation of Sample 1 obtained are shown in Table 1. Table 1 shows the following.

In X-ray diffraction analysis, no diffraction peak characteristic of crystals was observed in the titanium oxide film of Sample 1. The film was hence found to be amorphous. This titanium oxide film had a residual triolein amount of 0% and a contact angle with pure water of as small as 9 degrees, showing that the surface thereof was satisfactorily hydrophilic. Furthermore, the antifouling performance thereof was rated as ○, which is the best.

EXAMPLES 2 TO 4

Multilayer structure Samples 2 to 4 were produced in the same manner as in Example 1, except that the content of niobium oxide was changed to 1.0% by weight, 5.0% by weight and 10.0% by weight, respectively. The evaluation results for these samples are shown in Table 1. In each sample, the titanium oxide film was amorphous when analyzed by the X-ray diffraction method, and the surface thereof was hydrophilic and had an antifouling effect based on photocatalytic function.

TABLE 1

| | Titanium oxide target | | | Titanium oxide film | | |
|---|---|---|---|---|---|---|
| | Minor metal oxide | | Surface | | Triolein-decomposing ability, residual | Contact angle with water | Anti-fouling |
| Sample No. | Ingredient | Content (wt %) | resistance (Ω/□) | Crystallinity | amount (%) | (degree) | performance |
| Sample 1 | Nb$_2$O$_5$ | 2.5 | 10 | amorphous | 0 | 9 | ○ |
| Sample 2 | Nb$_2$O$_5$ | 1.0 | 5 | amorphous | 4 | 11 | ○ |
| Sample 3 | Nb$_2$O$_5$ | 5.0 | 10 | amorphous | 2 | 9 | ○ |
| Sample 4 | Nb$_2$O$_5$ | 10.0 | 20 | amorphous | 6 | 11 | ○ |

(Notes)
Substrate temperature: 230° C.
Titanium oxide film thickness: 250 nm

EXAMPLE 5

A multilayer structure sample was produced in the same manner as in Example 1, except that prior to the titanium oxide film formation, a primer film of silicon dioxide having a thickness of 50 nm was formed by high-frequency sputtering using quartz glass as a target. Multilayer structure Sample 5 thus obtained was subjected to the film evaluations in the same manner as in Example 1, and the results obtained are shown in Table 2.

EXAMPLE 6

A multilayer structure sample was produced in the same manner as in Example 3. Thereafter, a hydrophilic film of silicon dioxide was formed on the titanium oxide film of the sample by high-frequency sputtering using quartz glass as a target. Multilayer structure Sample 6 thus obtained was subjected to the film evaluations in the same manner as in Example 1, and the results obtained are shown in Table 2. The results for Sample 1, which had neither a primer film nor a hydrophilic film, are also shown in Table 2 for the sake of comparison.

Table 2 shows that Sample 5 and Sample 6 both had satisfactory triolein-decomposing ability and that especially in Sample 6, the surface of the multilayer structure had improved hydrophilicity.

TABLE 2

| | Primer film | | Hydrophilic film | | Titanium oxide film | | | |
|---|---|---|---|---|---|---|---|---|
| Sample No. | Material | Thickness (nm) | Material | Thickness (nm) | Crystallinity | Triolein-decomposing ability, residual amount (%) | Contact angle with water (degree) | Anti-fouling performance |
| Sample 5 | SiO$_2$ | 50 | none | | amorphous | 0 | 9 | ○ |
| Sample 6 | SiO$_2$ | 50 | SiO$_2$ | 10 | amorphous | 27 | 7 | ○ |
| Sample 1 | none | | none | | amorphous | 0 | 9 | ○ |

(Notes)
Nb$_2$O$_5$ content: 2.5 wt %
Substrate temperature: 230° C.
Substrate thickness: 250 nm

EXAMPLES 7 TO 12

Multilayer structure Samples 7 to 12 were produced in the same manner as in Example 1, except that the niobium oxide was replaced with each of the various metal oxides shown in Table 3. These multilayer structures were examined for photocatalytic performance in the same manner as in Example 1, and the results obtained are shown in Table 3. The titanium oxide sinter targets respectively containing those metal oxides each had such a surface resistance that a glow discharge could be stably generated. It was further found that the multilayer structures obtained had satisfactory photocatalytic performance and antifouling performance based on it.

ture was changed to 170° C., 200° C., 250° C. and 270° C., respectively, for the purpose of examining the influence of the substrate temperature during film deposition on the photocatalytic activity of the titanium oxide film. The evaluation results for the samples obtained are shown in Table 4 together with the results for Sample 1.

COMPARATIVE EXAMPLES 1 TO 4

Multilayer structure samples were produced in the same manner as in Example 1, except that the substrate tempera-

TABLE 3

| | Titanium oxide target | | | Titanium oxide film | | | |
|---|---|---|---|---|---|---|---|
| | Minor metal oxide | | Surface | | Triolein-decomposing ability, residual amount (%) | Contact angle with water (degree) | Anti-fouling performance |
| Sample No. | Ingredient | Content (wt %) | resistance (Ω/□) | Crystallinity | | | |
| Sample 7 | Ta$_2$O$_5$ | 2.5 | 10 | amorphous | 7 | 10 | ○ |
| Sample 8 | V$_2$O$_5$ | 2.5 | 5 | amorphous | 8 | 10 | ○ |
| Sample 9 | ZrO$_2$ | 2.5 | 30 | amorphous | 5 | 10 | ○ |
| Sample 10 | SnO$_2$ | 2.5 | 15 | amorphous | 9 | 11 | ○ |
| Sample 11 | Cr$_2$O$_3$ | 2.5 | 30 | amorphous | 10 | 12 | ○ |
| Sample 12 | CuO | 2.5 | 15 | amorphous | 8 | 11 | ○ |

(Notes)
Film thickness: 250 nm
Substrate temperature: 230° C.

EXAMPLES 13 TO 16

Multilayer structure samples were produced in the same manner as in Example 1, except that the substrate temperature was changed to room temperature (no heating), 150° C., 300° C. and 350° C., respectively. The evaluation results for Comparative Samples 1 to 4 thus obtained are shown in Table 4.

TABLE 4

| | Titanium oxide target | | Substrate | | Titanium oxide film | | | |
|---|---|---|---|---|---|---|---|---|
| | Minor metal oxide | | | | | | | |
| Sample No. | Ingredient | Content (wt %) | Temperature (° C.) | Thickness (nm) | Crystallinity | Triolein-decomposing ability, residual amount (%) | Contact angle with water (degree) | Anti-fouling performance |
| Comparative Sample 1 | Nb$_2$O$_5$ | 2.5 | room temp. | 250 | amorphous | 96 | 22 | x |
| Comparative Sample 2 | Nb$_2$O$_5$ | 2.5 | 150 | 250 | amorphous | 93 | 21 | x |
| Sample 13 | Nb$_2$O$_5$ | 2.5 | 170 | 250 | amorphous | 25 | 13 | ○ |
| Sample 14 | Nb$_2$O$_5$ | 2.5 | 200 | 250 | amorphous | 9 | 11 | ○ |
| Sample 1 | Nb$_2$O$_5$ | 2.5 | 230 | 250 | amorphous | 0 | 9 | ○ |
| Sample 15 | Nb$_2$O$_5$ | 2.5 | 250 | 250 | amorphous | 6 | 9 | ○ |
| Sample 16 | Nb$_2$O$_5$ | 2.5 | 270 | 250 | amorphous | 9 | 10 | ○ |
| Comparative Sample 3 | Nb$_2$O$_5$ | 2.5 | 300 | 250 | anatase | 32 | 14 | Δ |
| Comparative Sample 4 | Nb$_2$O$_5$ | 2.5 | 350 | 250 | anatase | 73 | 17 | Δ |

Table 4 shows that from the standpoint of imparting sufficient photocatalytic activity to the titanium oxide film, the substrate temperature during film formation is preferably 170° C. or higher and 270° C. or lower. FIG. 2 shows a plot of the relationship between the found values of residual triolein amount shown in Table 4 and the substrate temperatures during film formation shown in Table 4. As the substrate temperature rises beyond 150° C., the residual triolein amount abruptly decreases, i.e., photocatalytic activity increases. On the other hand, as the substrate temperature lowers from 350° C., the residual triolein amount decreases, i.e., photocatalytic activity increases. It can be seen from this relationship that high photocatalytic activity is obtained when the substrate temperature is from 170 to 270° C., and even higher catalytic activity (a reduced residual triolein amount) is obtained when the substrate temperature is from 200 to 250° C.

FIG. 3 shows X-ray diffraction charts for the titanium oxide films of the samples for which substrate temperatures of room temperature (no substrate heating), 150° C., 230° C. and 300° C. had been used, respectively. In the samples for which substrate temperatures of 300° C. and 350° C. had been used respectively, the diffraction peak attributable to the (101) plane of anatase crystals was observed. In contrast, the sample for which the substrate had not been heated and the samples for which substrate temperatures of 150° C. and 230° C. had respectively been used each showed no diffraction peak, showing that the titanium oxide films of these samples were substantially amorphous.

From the Examples and Comparative Examples given above, it could be seen that when a titanium oxide film is formed at substrate temperatures not lower than 300° C., the titanium oxide film deposited is not amorphous but composed of anatase crystals and this titanium oxide film has reduced photocatalytic activity (an increased residual triolein amount). Namely, it was found that a titanium oxide film having satisfactory photocatalytic activity is obtained at relatively low temperatures (nearly the same as or lower than the heat resistance temperatures of organic resin materials and the like, which are around 250° C.)

The samples for which substrate temperatures of room temperature and 150° C. had been used had low photocatalytic activity whereas the samples for which substrate temperatures ranging from 170° C. to 270° C. had been used had high photocatalytic activity, despite the fact that these two groups of samples had such a common property that the titanium oxide film was amorphous when analyzed by the X-ray diffraction method. Although the reason for this has not been elucidated, it is presumed that in each of the samples in the latter group, microcrystals not detectable by the X-ray diffraction method are present in the amorphous matrix and make some contribution to photocatalytic activity.

EXAMPLES 17 TO 19

Multilayer structure Samples 17 to 19 were produced in the same manner as in Example 1, except that the thickness of the titanium oxide film was changed to 50 nm, 100 nm and 500 nm, respectively, for the purpose of examining the influence of titanium oxide film thickness on photocatalytic performance. The evaluation results for these samples are shown in Table 5 together with the results for Sample 1. It was found that as the film thickness increases, both the value of residual triolein amount, as a measure of triolein-decomposing ability, and the value of contact angle with water decrease.

TABLE 5

| Sample No. | Titanium oxide target Minor metal oxide Ingredient | Content (wt %) | Substrate Temperature (° C.) | Thickness (nm) | Crystallinity | Titanium oxide film Triolein-decomposing ability, residual amount (%) | Contact angle with water (degree) | Anti-fouling performance |
|---|---|---|---|---|---|---|---|---|
| Sample 17 | $Nb_2O_5$ | 2.5 | 230 | 50 | amorphous | 91 | 21 | x |
| Sample 18 | $Nb_2O_5$ | 2.5 | 230 | 100 | amorphous | 57 | 16 | Δ |
| Sample 1 | $Nb_2O_5$ | 2.5 | 230 | 250 | amorphous | 0 | 9 | ○ |
| Sample 19 | $Nb_2O_5$ | 2.5 | 230 | 500 | amorphous | 0 | 8 | ○ |

EXAMPLE 20

Mmultilayer structure Sample 20 was produced in the same manner as in Example 1, except that the composition of the surrounding gas was changed in order to examine the influence of the sputtering gas atmosphere (gas composition introduced into the film-formation chamber) used for titanium oxide film formation on photocatalytic performance. The results of the examinations of the titanium oxide film obtained are shown in Table 6 together with the results for Sample 1. It was found that a high oxygen concentration in the atmosphere gives a titanium oxide film comprising anatase crystals and having reduced triolein-decomposing ability. Namely, this experiment showed that for forming a titanium oxide film having high photocatalytic activity, it is advantageous to conduct film formation in an atmosphere containing a small amount of oxygen.

soda-lime silicate composition under the conditions shown in Table 7 to produce a multilayer structure. The gas composition of the atmosphere used for sputtering was regulated so as to have an oxygen content of 100% in order to secure transparency of the titanium oxide. Comparative Sample 5 of multilayer structure thus obtained was evaluated. As a result, the sample had poor triolein-decomposing ability as shown in Table 7.

COMPARATIVE EXAMPLE 6

Sputtering was conducted in the same manner as in Comparative Example 5, except that the substrate temperature was changed to 350° C. Thus, Comparative Sample 6 of multilayer structure was produced. Although the titanium

TABLE 6

| Sample No. | Titanium oxide target $Nb_2O_5$ amount (wt %) | Substrate temperature (° C.) | Surrounding gas composition, oxygen/argon (vol %) | Crystallinity | Titanium oxide film Triolein-decomposing ability, residual amount (%) | Contact angle with water (degree) | Anti-fouling performance |
|---|---|---|---|---|---|---|---|
| Sample 20 | 2.5 | 230 | 60/40 | anatase | 50 | 17 | Δ |
| Sample 1 | 2.5 | 230 | 6/94 | amorphous | 0 | 9 | ○ |

COMPARATIVE EXAMPLE 5

Using titanium metal as a target, a titanium oxide film having a thickness of 250 nm was formed by direct-current sputtering on a 30 cm-square float glass plate having a oxide film of this multilayer structure had an anatase crystal structure, it had low triolein-decomposing ability (a large residual triolein amount) and insufficient antifouling performance.

TABLE 7

| Sample No. | Target | Substrate temperature (° C.) | Surrounding gas composition, oxygen/argon (vol %) | Crystallinity | Titanium oxide film Triolein-decomposing ability, residual amount (%) | Contact angle with water (degree) | Anti-fouling performance |
|---|---|---|---|---|---|---|---|
| Comparative Sample 5 | titanium metal | 230 | 100/0 | anatase | 89 | 22 | x |
| Comparative Sample 6 | titanium metal | 350 | 100/0 | anatase | 75 | 19 | Δ |

The above results show that in order for the conventional reactive sputtering method using titanium metal as a target to obtain a titanium oxide film having photocatalytic activity, the substrate should be heated to a temperature as high as 350° C., and that the photocatalytic activity thus obtained is not so high. The results further show that a titanium oxide film having photocatalytic activity cannot be obtained at a substrate temperature of 230° C., i.e., a titanium oxide film having high catalytic activity cannot be obtained at low temperatures.

The above Examples and Comparative Examples demonstrate that according to the process of the present invention for producing a multilayer structure, films having high catalytic activity can be obtained at relatively low substrate temperatures of 270° C. or lower. The Examples further demonstrate that the photocatalytically active titanium oxide films obtained have antifouling properties and are practically useful.

According to the process of the present invention for producing a multilayer structure, a photocatalytically active titanium oxide film is formed on a substrate by sputtering in an atmosphere capable of having a regulated vacuum using a conductive sinter target obtained by sintering a mixture of particles of titanium oxide and particles of at least one metal oxide selected from the group consisting of niobium oxide, tantalum oxide, vanadium oxide, zirconium oxide, tin oxide, chromium oxide and copper oxide. Consequently, a multilayer structure having a photocatalytically active film can be produced at high rate without the necessity of heating the substrate at high temperature.

As a result, it has become possible to produce a multilayer structure using a large glass plate as a substrate, such as a window glass, using a sputtering apparatus having a simplified heating mechanism. The equipment cost can hence be reduced.

Since lower substrate temperatures can be used in substrate heating, a photocatalytically active film can be formed on organic resin substrates and the like.

Furthermore, by regulating the conductivity of the sinter target so that the surface resistance thereof is 500 Ω/☐ or lower, not only a multilayer structure can be produced with a direct current glow discharge continuing stably, but also a film having enhanced catalytic activity can be obtained when the substrate is heated to 170 to 270° C.

The multilayer structure of the present invention has a titanium oxide film which contains as a minor component at least one metal oxide selected from the group consisting of niobium oxide, tantalum oxide, vanadium oxide, zirconium oxide, tin oxide, chromium oxide and copper oxide, and which is substantially amorphous when analyzed by the X-ray diffraction method. Due to this constitution, the multilayer structure has high photocatalytic activity.

By regulating the content of the metal oxide(s) as the minor component to 1 to 10% by weight, the titanium oxide film can be an amorphous film having high photocatalytic activity.

Furthermore, by interposing, between the substrate and the titanium oxide film, a primer film which serves to prevent any alkali component of the substrate from dissolving in the titanium oxide film, the photocatalytic activity of the multilayer structure can be made to last over long period of time. Moreover, by partly or wholly coating the titanium oxide film with a hydrophilic film, the surface of the multilayer structure can be made more hydrophilic and the antifouling properties can be enhanced.

What is claimed is:

1. A multilayer structure comprising a substrate and formed thereon a film mainly comprising titanium oxide and having photocatalytic activity, said film containing as a minor component at least one metal oxide selected from the group consisting of niobium oxide, tantalum oxide, vanadium oxide, zirconium oxide, tin oxide, chromium oxide and copper oxide, and being substantially amorphous when analyzed by the X-ray diffraction method.

2. The multilayer structure as claimed in claim 1, wherein the substantially amorphous film mainly comprising titanium oxide comprises an amorphous matrix containing microcrystals.

3. The multilayer structure as claimed in claim 1, wherein the content of the metal oxide as the minor component in the film mainly comprising titanium oxide is from 1 to 10% by weight.

4. The multilayer structure as claimed in claim 3, wherein the metal oxide as the minor component is niobium oxide.

5. The multilayer structure as claimed in claim 1, which has, interposed between the substrate and the film mainly comprising titanium oxide, a primer film which serves to prevent any alkali component of the substrate from dissolving in the film mainly comprising titanium oxide.

6. The multilayer structure as claimed in claim 1, wherein the film mainly comprising titanium oxide is coated with a hydrophilic film.

7. The multilayer structure as claimed in claim 6, which has, interposed between the substrate and the film mainly comprising titanium oxide, a primer film which serves to prevent any alkali component of the substrate from dissolving in the film mainly comprising titanium oxide, wherein the primer film and the hydrophilic film each is a film of silicon dioxide.

* * * * *